(12) United States Patent
Huang et al.

(10) Patent No.: US 11,791,576 B2
(45) Date of Patent: Oct. 17, 2023

(54) ELECTRICAL CONNECTOR ASSEMBLY AND ELECTRICAL CONNECTOR THEREOF

(71) Applicant: PEGATRON CORPORATION, Taipei (TW)

(72) Inventors: Ho-Ching Huang, Taipei (TW); Chien-Hao Hsu, Taipei (TW); Chyi-Nan Chen, Taipei (TW); Chuan-Yuan Lin, Taipei (TW); Po-Chun Chen, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 84 days.

(21) Appl. No.: 17/508,627

(22) Filed: Oct. 22, 2021

(65) Prior Publication Data

US 2022/0216629 A1 Jul. 7, 2022

(30) Foreign Application Priority Data

Jan. 7, 2021 (TW) ................................ 110100668

(51) Int. Cl.
*H01R 12/59* (2011.01)
*H01R 13/502* (2006.01)
*H01R 13/40* (2006.01)
*H01R 12/57* (2011.01)
*H01R 24/60* (2011.01)

(52) U.S. Cl.
CPC .......... *H01R 12/592* (2013.01); *H01R 12/57* (2013.01); *H01R 13/40* (2013.01); *H01R 13/502* (2013.01); *H01R 24/60* (2013.01)

(58) Field of Classification Search
CPC .. H01R 13/6584; H01R 13/502; H01R 13/40; H01R 12/592; H01R 12/57; H01R 24/60
USPC ................................................ 439/91, 607.02
See application file for complete search history.

(56) References Cited

U.S. PATENT DOCUMENTS

| 4,349,241 | A | * | 9/1982 | Juris | ................... | H01R 13/6584 |
| | | | | | | 439/271 |
| 4,529,257 | A | * | 7/1985 | Goodman | .......... | H01R 13/6584 |
| | | | | | | 439/271 |
| 5,588,846 | A | * | 12/1996 | Irlbeck | ................... | H01R 12/62 |
| | | | | | | 439/65 |
| 9,014,756 | B2 | * | 4/2015 | Zhuang | ................ | H04B 1/3816 |
| | | | | | | 455/575.1 |
| 10,212,864 | B1 | * | 2/2019 | Roath | ................... | F16J 15/128 |

(Continued)

FOREIGN PATENT DOCUMENTS

| CN | 104661505 A | 5/2015 |
| TW | 201225780 A1 | 6/2012 |
| TW | M-584995 U | 10/2019 |

*Primary Examiner* — Gary F Paumen
(74) *Attorney, Agent, or Firm* — MUNCY, GEISSLER, OLDS & LOWE, P.C.

(57) ABSTRACT

The present invention discloses an electrical connector and an electrical connector assembly. The electrical connector includes a circuit board, a connection port, and an insulating member. The circuit board has a conductive region, located on a surface of the circuit board. The connection port is arranged on the surface of the circuit board, and the connection port is electrically connected to the circuit board. The insulating member is arranged on the circuit board, and surrounds an outer periphery of the connection port. The insulating member includes a metal layer, arranged on an outer surface of the insulating member.

11 Claims, 5 Drawing Sheets

(56) References Cited

U.S. PATENT DOCUMENTS

| | | | |
|---|---|---|---|
| 10,594,074 B1* | 3/2020 | Zhao | H01R 13/6205 |
| 11,349,263 B1* | 5/2022 | Shaw | H01R 24/56 |
| 2012/0138354 A1* | 6/2012 | Lin | H05K 9/0015 |
| | | | 29/829 |
| 2016/0190719 A1* | 6/2016 | Brzezinski | H01R 12/716 |
| | | | 29/874 |
| 2021/0281018 A1* | 9/2021 | Saheb | H05K 3/366 |

* cited by examiner

ELECTRICAL CONNECTOR ASSEMBLY AND ELECTRICAL CONNECTOR THEREOF

BACKGROUND

Technical Field

The disclosure relates to a connector, and in particular to an electrical connector and an electrical connector assembly.

Related Art

Nowadays, commercially available electrical connectors with a high-speed signal connection port are becoming increasingly popular. It is definitely convenient to use an electrical connector with a high-speed signal connection port (for example, an electrical connector with a USB 3.2 Type-C connector). However, such an electrical connector is prone to signal interference during implementation. Specifically, a signal may overflow to other positions and the outside of the electrical connector through an exposed connection port to generate noise.

To channel and shield against the noise, at this stage, a conductive or shielding material such as a conductive foam is arranged on the periphery of the connection port. However, thread or lint is often produced during cutting of the conductive or shielding material such as the conductive foam. If the thread or lint contacts the connection port, a short circuit may occur, and it is needed to improve.

SUMMARY

In view of the above-mentioned problems, a main purpose of the present invention is to provide an electrical connector assembly and an electrical connector, which can use the arrangement of insulating members to solve a problem that short circuits frequently occur in conventional electrical connectors.

To achieve the above-mentioned objective, the present invention provides an electrical connector, including a circuit board, a connection port, and an insulating member. The circuit board has a conductive region, located on a surface of the circuit board. The connection port is arranged on the surface of the circuit board, and the connection port is electrically connected to the circuit board. The insulating member is arranged on the circuit board and surrounds an outer periphery of the connection port. The insulating member includes a metal layer, arranged on an outer surface of the insulating member.

According to an embodiment of the present invention, the conductive region surrounds the connection port.

According to an embodiment of the present invention, the insulating member is made of an elastic material.

According to an embodiment of the present invention, the electrical connector further includes a conductive member, arranged in the conductive region of the circuit board, and surrounding an outer periphery of the insulating member.

According to an embodiment of the present invention, the conductive member is a conductive foam.

According to an embodiment of the present invention, the circuit board is a flexible circuit board.

To achieve the above-mentioned objective, the present invention further provides an electrical connector assembly, which includes a first connector and a second connector. The first connector includes a first circuit board, a first connection port, and an insulating member. The first circuit board has a first conductive region, located on a surface of the first circuit board. The first connection port is arranged on the surface of the first circuit board, and is electrically connected to the first circuit board. The insulating member is arranged on the first circuit board, and surrounds an outer periphery of the first connection port. The insulating member includes a metal layer, arranged on an outer surface of the insulating member. The second connector includes a second circuit board and a second connection port. The second circuit board has a second conductive region located on a surface of the second circuit board. The second connection port is arranged on the surface of the second circuit board, and is electrically connected to the second circuit board.

According to an embodiment of the present invention, the first conductive region surrounds the first connection port, and the second conductive region surrounds the second connection port.

According to an embodiment of the present invention, the first connector further includes a conductive member, arranged in the first conductive region of the first circuit board, and surrounding an outer periphery of the insulating member. When the second connection port is connected to the first connection port, the conductive member contacts the second conductive region.

According to an embodiment of the present invention, the first circuit board is a flexible circuit board.

In summary, for the electrical connector and the electrical connector assembly according to the present invention, the (first) electrical connector includes the insulating member and is arranged on the outer periphery of the (first) connection port, so that noise overflow can be avoided, and insulation can be implemented.

In addition, the insulating member can separate the conductive member from the (first) connection port, and can also prevent thread or lint of the conductive member from contacting the (first) connection port, so as to avoid a short circuit.

DETAILED DESCRIPTION

Figure 1:
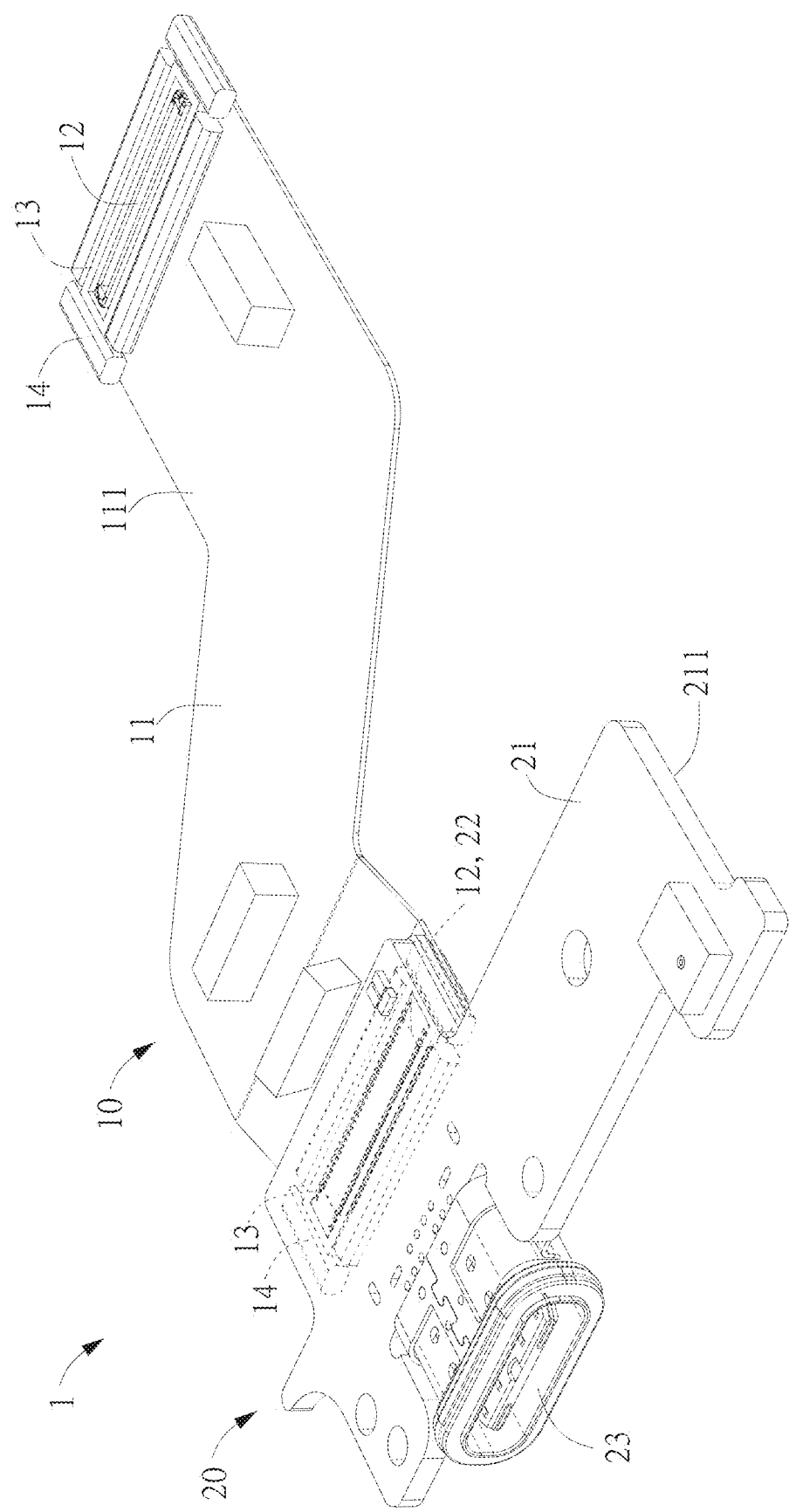
FIG. 1 is a schematic diagram of an electrical connector assembly according to an embodiment of the present invention.

In order to better understand technical content of the present invention, preferred specific embodiments are described as follows. A specific implementation of the present invention will be further described below with reference to accompanying drawings and embodiments. The following embodiments are only configured to illustrate technical solutions of the present invention more clearly, and cannot be configured to limit a protection scope of the present invention.

In a description of the various embodiments, the so-called "first", "second", and "third" are configured to describe different elements, and these elements are not limited by such predicates. In addition, for a convenience and clarity of the description, a thickness or a size of each element in the drawings is expressed in an exaggerated or omitted or general manner for an understanding and reading of persons familiar with the art, and the size of each element is not exactly an actual size of the element, and is not configured to limit the implementation of the present invention, and therefore does not have any technical significance. Any structural modification, change of proportional relationship, or size adjustment should still fall within the scope of the technical content disclosed in the present invention without affecting an effect and an objective that can be achieved by the present invention. The same reference numerals will be configured to indicate the same or similar elements in all the drawings.

Figure 2:
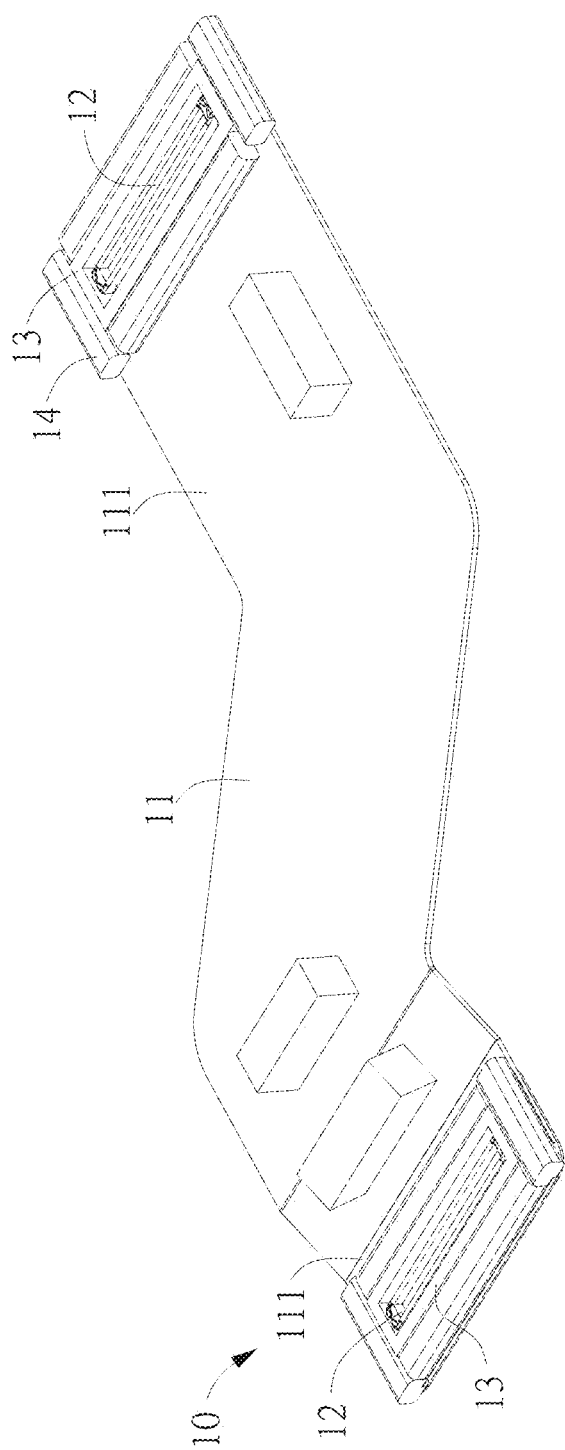
FIG. 2 is a schematic diagram of a first connector shown in FIG. 1.
Figure 3:
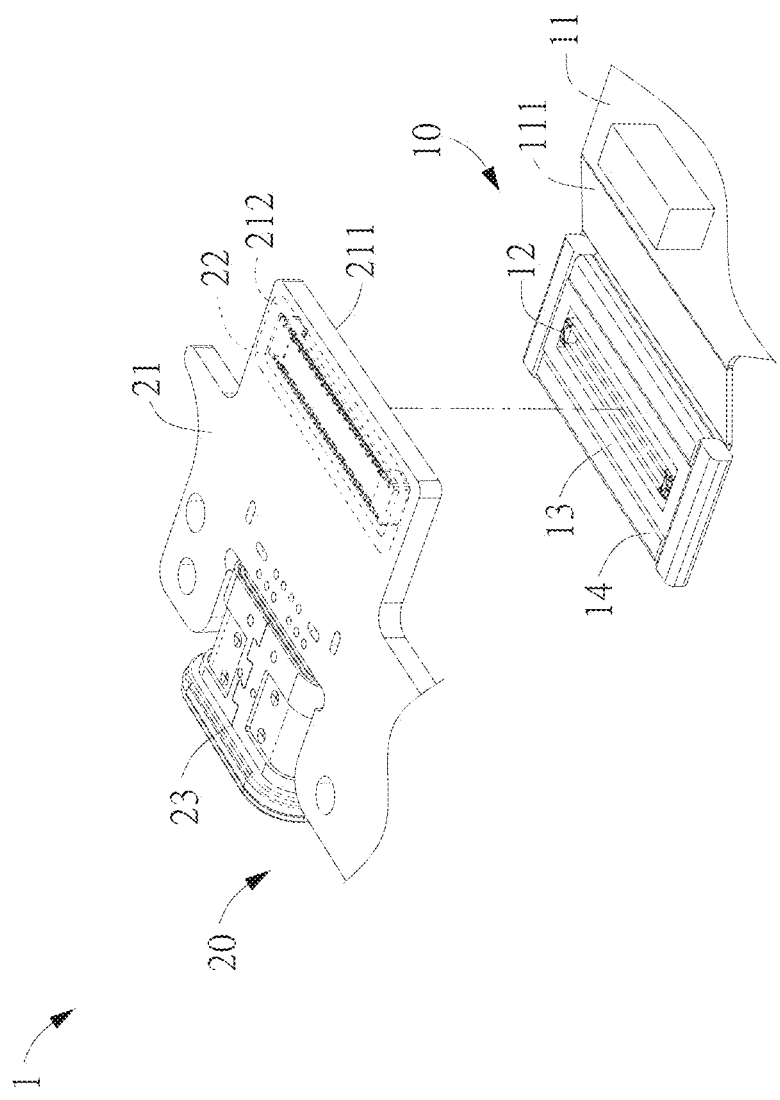
FIG. 3 is a partial schematic exploded view of a first connector and a second connector shown in FIG. 1.
Figure 4:
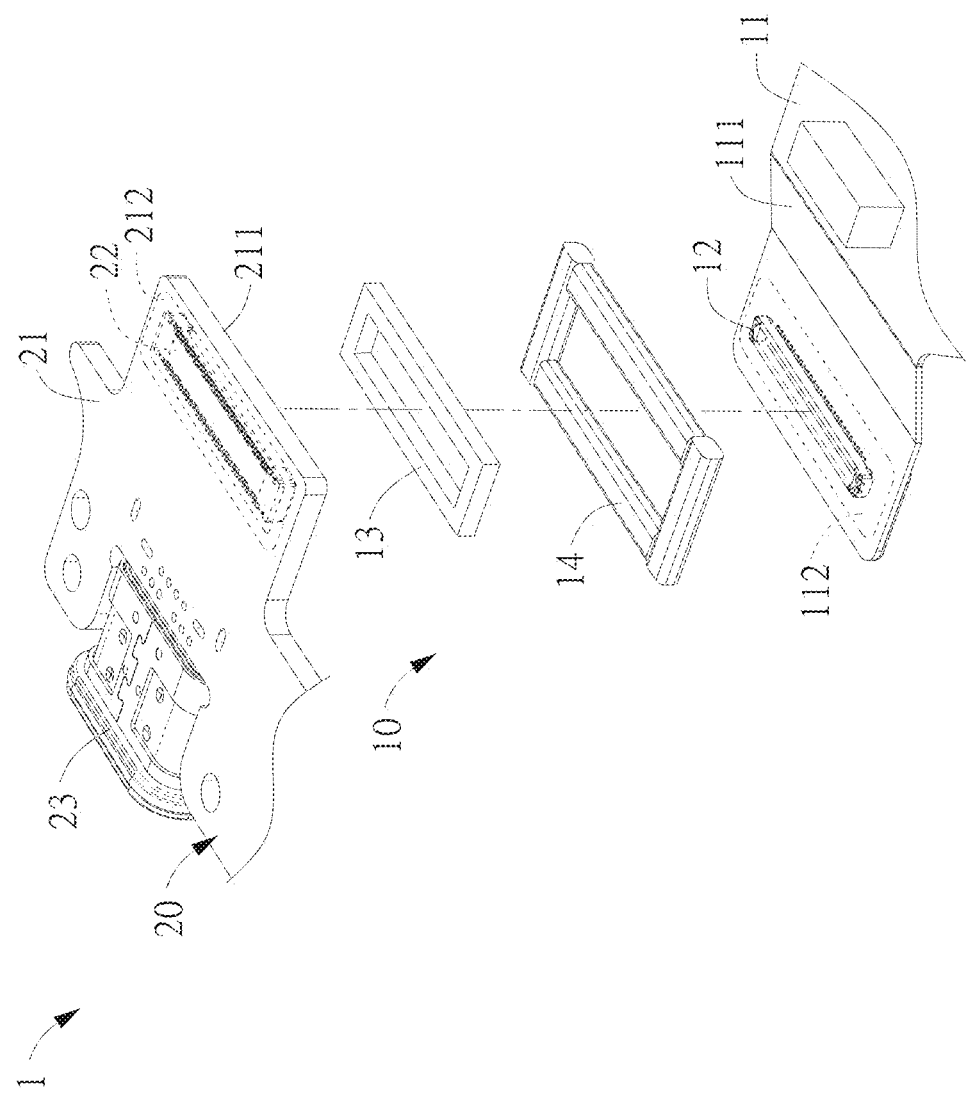
FIG. 4 is a schematic exploded view of the first connector shown in FIG. 3.

FIG. 1 is a schematic diagram of an electrical connector assembly according to an embodiment of the present invention. FIG. 2 is a schematic diagram of a first connector shown in FIG. 1. FIG. 3 is a partial schematic exploded view of a first connector and a second connector shown in FIG. 1. FIG. 4 is a schematic exploded view of the first connector shown in FIG. 3. Refer to FIG. 1, FIG. 2, FIG. 3, and FIG. 4 at the same time. In this embodiment, an electrical connector assembly 1 includes a first connector 10 and a second connector 20. The first connector 10 includes a first circuit board 11, at least one first connection port 12, an insulating member 13, and a conductive member 14.

Preferably, the first circuit board 11 may be a flexible circuit board, that is, a soft circuit board. In this embodiment, the first connector 10 has two first connection ports 12 arranged at two opposite ends of the first circuit board 11. In addition, the first connection ports 12 are arranged on a surface 111 of the first circuit board 11, and the first connection ports 12 are electrically connected to the first circuit board 11. Specifically, a plurality of circuits may be provided inside the first circuit board 11 for electrical connection to the first connection ports 12, and the first connection ports 12 at the two ends can be electrically connected to each other by the circuits. In other embodiments, the first circuit board 11 may be alternatively a rigid circuit board, such as a printed circuit board with a multi-layer structure, which is not limited in the present invention.

Correspondingly, the second connector 20 includes a second circuit board 21 and a second connection port 22. Similarly, the second circuit board 21 may be a flexible circuit board or a rigid circuit board, which is not limited in the present invention. The second connection port 22 is arranged on a surface 211 of the second circuit board 21, and a plurality of circuits may be provided inside the second circuit board 21, to electrically connect the second connection port 22 to the second circuit board 21. Preferably, in this embodiment, the first connection port 12 and the second connection port 22 may be a male member and a female member of a board-to-board connector. In other words, the first connection port 12 and the second connection port 22 may be connected to each other, as shown in FIG. 1, and are therefore applicable to different electronic devices (or circuit boards) to transmit signals to each other.

It should further be noted that because the first connection port 12 is connected to the second connection port 22, the first connection port 12 and the second connection port 22 in FIG. 1 are marked at the same position. In addition, from the perspective of FIG. 1, FIG. 3, and FIG. 4, the surface 211 on which the second connection port 22 is arranged is a bottom surface. Therefore, the surface 211 is marked at a side line, and the second connection port 22 is marked by a dashed line.

Moreover, in this embodiment, the second connector 20 further includes a high-speed signal connection port 23, which may be, for example, but not limited to, a USB 3.2 Type-C connector. The high-speed signal connection port 23 is arranged on the second circuit board 21, and the high-speed signal connection port 23 and the second connection port 22 may be electrically connected to each other by the circuits inside the second circuit board 21. When the high-speed signal connection port 23 is configured to transmit signals, there is noise interference. In this embodiment, a conductive region is formed by the first circuit board 11 and the second circuit board 21, and the insulating member 13 and the conductive member 14 are arranged, to channel and shield against noise.

As shown in FIG. 4, the first circuit board 11 has a first conductive region 112 located on the surface 111 of the first circuit board 11. Similarly, the second circuit board 21 has a second conductive region 212 located on the surface 211 of the second circuit board 21. In other words, the first conductive region 112 and the second conductive region 212 are respectively exposed from the first circuit board 11 and the second circuit board 21. In addition, the first conductive region 112 and the second conductive region 212 are still electrically connected to the circuits inside the first circuit board 11 and the second circuit board 21. Therefore, the first conductive region 112 and the second conductive region 212 may also be referred to as ground portions. The first conductive region 112 and the second conductive region 212 may be, for example, but not limited to, an ENIG layer, an electromagnetic shielding (electromagnetic interference, EMI) layer, or a thin copper layer. In this embodiment, the ENIG layer is used as an example for the first conductive region 112 and the second conductive region 212. Preferably, the first conductive region 112 surrounds the first connection port 12, and the second conductive region 212 surrounds the second connection port 22. It should be noted that in other embodiments of the present invention, the first conductive region 112 may not surround the first connection port 12, provided that the conductive member 14 contacts part or all of the first conductive region 112.

The first connector 10 includes the insulating member 13 and the conductive member 14. The insulating member 13 is arranged on the first circuit board 11, and surrounds an outer periphery of the first connection port 12, to avoid noise overflow and implement insulation. Therefore, the insulating member 13 may be an annular member. Preferably, the insulating member 13 is made of an elastic material, which may be, for example, but not limited to, rubber or plastic. A property of the elastic material allows the insulating member 13 to be directly sleeved on the periphery of the first connection port 12 without the use of another fixing structure. The conductive member 14 is arranged in the first conductive region 112 of the first circuit board 11, and surrounds an outer periphery of the insulating member 13. In other words, the insulating member 13 is located between the first connection port 12 and the conductive member 14.

When the first connector 10 is joined to the second connector 20, that is, when the second connection port 22 is connected to the first connection port 12 (as shown in FIG. 1), the conductive member 14 of the first connector 10 contacts the second conductive region 212 (referring to FIG. 3), to form electrical conduction and annular shielding, to channel and shield against noise. Preferably, the conductive member 14 is a compressible conductive foam, and a height of the conductive member 14 is slightly greater than that of the first connection port 12. Because the conductive member 14 is compressible, the conductive member 14 does not prevent the second connection port 22 from being connected to the first connection port 12, and can further ensure that the conductive member 14 can contact the second conductive region 212.

Generally, the conductive foam (the conductive member 14) is cut into an appropriate size to surround the outer periphery of the first connection port 12 and the outer periphery of the insulating member 13. However, thread or lint may be produced during cutting. The insulating member 13 is arranged between the conductive member 14 and the first connection port 12, to avoid the thread or lint from contacting the first connection port 12. In other words, the conductive member 14 and the first connection port 12 are separated by the insulating member 13, so that thread or lint of the conductive foam (the conductive member 14) can be prevented from contacting the first connection port 12.

Specifically, in this embodiment, if the first connector 10 does not have an insulating member 13, when the first connector 10 is joined to the second connector 20, if thread or lint contacts a first connection port 12 or a second connection port 22, a short circuit may occur. In comparison, the insulating member 13 in this embodiment is arranged, so that thread or lint of the conductive foam (the conductive member 14) contacts the insulating member 13, so as to avoid a short circuit.

Figure 6:
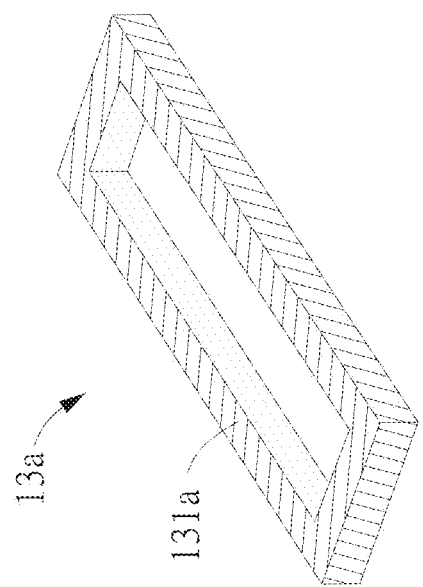
FIG. 6 is a schematic diagram of an insulating material according to another embodiment of the present invention.
Figure 5:
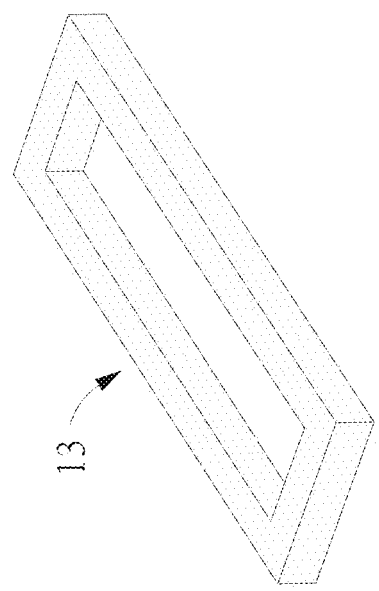
FIG. 5 is a schematic enlarged view of an insulating material shown in FIG. 4.

FIG. 5 is a schematic enlarged view of an insulating material shown in FIG. 4. FIG. 6 is a schematic diagram of an insulating material according to another embodiment of the present invention. In an embodiment, as shown in FIG. 5, the entire insulating member 13 may be made of an insulating material. In another embodiment, as shown in FIG. 6, an insulating member 13a further includes a metal layer 131a, and the metal layer 131a is arranged on an outer surface of the insulating member 13a. It should be noted that the insulating member 13a is an annular member, and a surface facing the first connection port 12 (referring to FIG. 3 and FIG. 4) is referred to as an inner surface, and the rest is the outer surface. In other words, the metal layer 131a may be arranged on the surface other than an inner surface of the insulating member 13a. The metal layer 131a may be used as an aid in channeling and shielding against noise. Even if the thread or lint of the conductive member 14 (referring to FIG. 3 and FIG. 4) contacts the metal layer 131a of the insulating member 13a, because the inner surface of the insulating member 13a is still made of the insulating material, a short circuit caused by connection to the first connection port 12 can still be avoided. In an embodiment of the present invention, a metal layer 131a may be made of gold or copper, but the present invention is not limited to thereto.

In addition, the present invention further provides an electrical connector. For component structures and features of the electrical connector, reference may be made to the first connector 10 in the above-mentioned embodiments. For example, the electrical connector also includes a circuit board, a connection port, an insulating member, and a conductive member. The circuit board has a conductive region, located on a surface of the circuit board. The connection port is arranged on the surface of the circuit board, and is electrically connected to the circuit board. The insulating member is arranged on the circuit board, and surrounds an outer periphery of the connection port. The conductive member is arranged in the conductive region of the circuit board, and surrounds an outer periphery of the insulating member. In addition, the electrical connector is used for being connected to another electrical connector, and the arrangement of the insulating member can avoid a short circuit as described above. For the structures and features of the circuit board, the conductive region, and the connection port, reference may be made to the first circuit board 11, the first conductive region 112, and the first connection port 12 in the above-mentioned embodiments, and details are not described herein again.

In summary, for the electrical connector and the electrical connector assembly according to the present invention, the (first) electrical connector includes the insulating member and is arranged on the outer periphery of the (first) connection port, so that noise overflow can be avoided, and insulation can be implemented.

In addition, the insulating member can separate a conductive member from the (first) connection port, and can also prevent thread or lint of the conductive member from contacting the (first) connection port, so as to avoid a short circuit.

It should be noted that many of the above-mentioned embodiments are given as examples for convenience of description, and the scope that the present invention seeks to protect should be subject to the scope of the patent application, but is not limited to the above-mentioned embodiments.

What is claimed is:

1. An electrical connector, comprising:
   a circuit board, having a conductive region located on a surface of the circuit board;
   a connection port, arranged on the surface of the circuit board, and electrically connected to the circuit board;
   an insulating member, arranged on the circuit board, surrounding an outer periphery of the connection port, comprising a metal layer arranged on an outer surface of the insulating member, and an inner surface of the insulating member being made of the insulating material; and a conductive member, arranged in the conductive region of the circuit board, and surrounding an outer periphery of the insulating member.

2. The electrical connector according to claim 1, wherein the conductive region surrounds the connection port.

3. The electrical connector according to claim 1, wherein the insulating member is made of an elastic material.

4. The electrical connector according to claim 1, wherein the conductive member is a conductive foam.

5. The electrical connector according to claim 1, wherein the circuit board is a flexible circuit board.

6. An electrical connector assembly, comprising:
   a first connector, comprising:
      a first circuit board, having a first conductive region located on a surface of the first circuit board;
      a first connection port, arranged on the surface of the first circuit board, and electrically connected to the first circuit board; and
      an insulating member, arranged on the circuit board, surrounding an outer periphery of the first connection port, comprising a metal layer arranged on an outer surface of the insulating member, and an inner surface of the insulating member being made of the insulating material; and
   a conductive member, arranged in the first conductive region of the first circuit board, and surrounding an outer periphery of the insulating member; and
   a second connector, comprising:
      a second circuit board, having a second conductive region located on a surface of the second circuit board; and a second connection port, arranged on the surface of the second circuit board, and electrically connected to the second circuit board.

7. The electrical connector assembly according to claim 6, wherein the first conductive region surrounds the first connection port, and the second conductive region surrounds the second connection port.

8. The electrical connector assembly according to claim 6, wherein the insulating member is made of an elastic material.

9. The electrical connector assembly according to claim 6, wherein when the second connection port is connected to the first connection port, the conductive member contacts the second conductive region.

10. The electrical connector assembly according to claim 6, wherein the conductive member is a conductive foam.

11. The electrical connector according to claim 6, wherein the first circuit board is a flexible circuit board.

\* \* \* \* \*